(12) United States Patent
Shiraishi

(10) Patent No.: US 10,707,317 B2
(45) Date of Patent: Jul. 7, 2020

(54) SEMICONDUCTOR DEVICE INCLUDING A BARRIER DIODE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Tatsuya Shiraishi, Nonoichi (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/106,335

(22) Filed: Aug. 21, 2018

(65) Prior Publication Data

US 2019/0288086 A1    Sep. 19, 2019

(30) Foreign Application Priority Data

Mar. 19, 2018    (JP) .................................. 2018-050468

(51) Int. Cl.
*H01L 29/732*    (2006.01)
*H01L 29/47*    (2006.01)
(Continued)

(52) U.S. Cl.
CPC .......... *H01L 29/47* (2013.01); *H01L 29/1095* (2013.01); *H01L 29/66477* (2013.01); *H01L 29/872* (2013.01); *H01L 29/0619* (2013.01)

(58) Field of Classification Search
CPC ... H01L 29/0804–0826; H01L 29/1004; H01L 29/1008; H01L 29/1095;
(Continued)

(56) References Cited

U.S. PATENT DOCUMENTS 3,737,742 A * 6/1973 Breuer .................... H01L 21/00
257/479
3,938,243 A * 2/1976 Rosvold .................. C23C 14/58
438/571
(Continued)

FOREIGN PATENT DOCUMENTS

JP    04-080961    3/1992
JP    2001-085705    3/2001
JP    4645641    3/2011

*Primary Examiner* — Eric A. Ward
(74) *Attorney, Agent, or Firm* — Oblon, McClelland, Maier & Neustadt, L.L.P.

(57) ABSTRACT

According to one embodiment, a semiconductor device includes a first semiconductor region of a first conductivity type, a first electrode, a second semiconductor region of a second conductivity type, a third semiconductor region of the first conductivity type, a second electrode, and a third electrode. The first semiconductor region includes a first region and a second region. The second semiconductor region is provided on the second region. The third semiconductor region is provided on a portion of the second semiconductor region. The third electrode is provided on the second semiconductor region and the first semiconductor region. A first layer is provided on the third electrode. The first layer includes at least one selected from the group consisting of titanium, nickel, and vanadium. A second layer is provided on the first layer. The second layer includes silicon and at least one selected from the group consisting of nitrogen and oxygen.

6 Claims, 2 Drawing Sheets

(51) Int. Cl.
*H01L 29/66* (2006.01)
*H01L 29/10* (2006.01)
*H01L 29/872* (2006.01)
*H01L 29/06* (2006.01)

(58) Field of Classification Search
CPC . H01L 29/47; H01L 29/475; H01L 29/66143; H01L 29/66234–29/66348; H01L 29/66477; H01L 29/872; H01L 29/73–7378; H01L 29/8725; H01L 29/6625; H01L 29/7308; H01L 29/735
See application file for complete search history.

(56) References Cited

U.S. PATENT DOCUMENTS

| | | | | |
|---|---|---|---|---|
| 3,943,554 A * | 3/1976 | Russell | ............... | H01L 27/0761 257/105 |
| 4,302,763 A * | 11/1981 | Ohuchi | ................. | H01L 29/04 257/187 |
| 4,333,100 A * | 6/1982 | Morcom | ............... | H01L 29/456 257/479 |
| 4,871,686 A * | 10/1989 | Davies | ................ | H01L 21/8222 438/328 |
| 5,438,218 A * | 8/1995 | Nakamura | ........ | H01L 21/28537 257/452 |
| 9,099,397 B1 * | 8/2015 | Li | ......................... | H01L 21/285 |
| 2002/0024050 A1 * | 2/2002 | Odekirk | .............. | H01L 21/0485 257/77 |
| 2017/0373174 A1 * | 12/2017 | Salzman | ........... | H01L 21/26513 |

* cited by examiner

SEMICONDUCTOR DEVICE INCLUDING A BARRIER DIODE

CROSS-REFERENCE TO RELATED APPLICATIONS

This application is based upon and claims the benefit of priority from Japanese Patent Application No. 2018-050468, filed on Mar. 19, 2018; the entire contents of which are incorporated herein by reference.

FIELD

Embodiments described herein relate generally to a semiconductor device.

BACKGROUND

There is a semiconductor device that includes a Schottky barrier diode. It is desirable for the fluctuation of the characteristics of the semiconductor device to be small.

DETAILED DESCRIPTION

Figure 1:
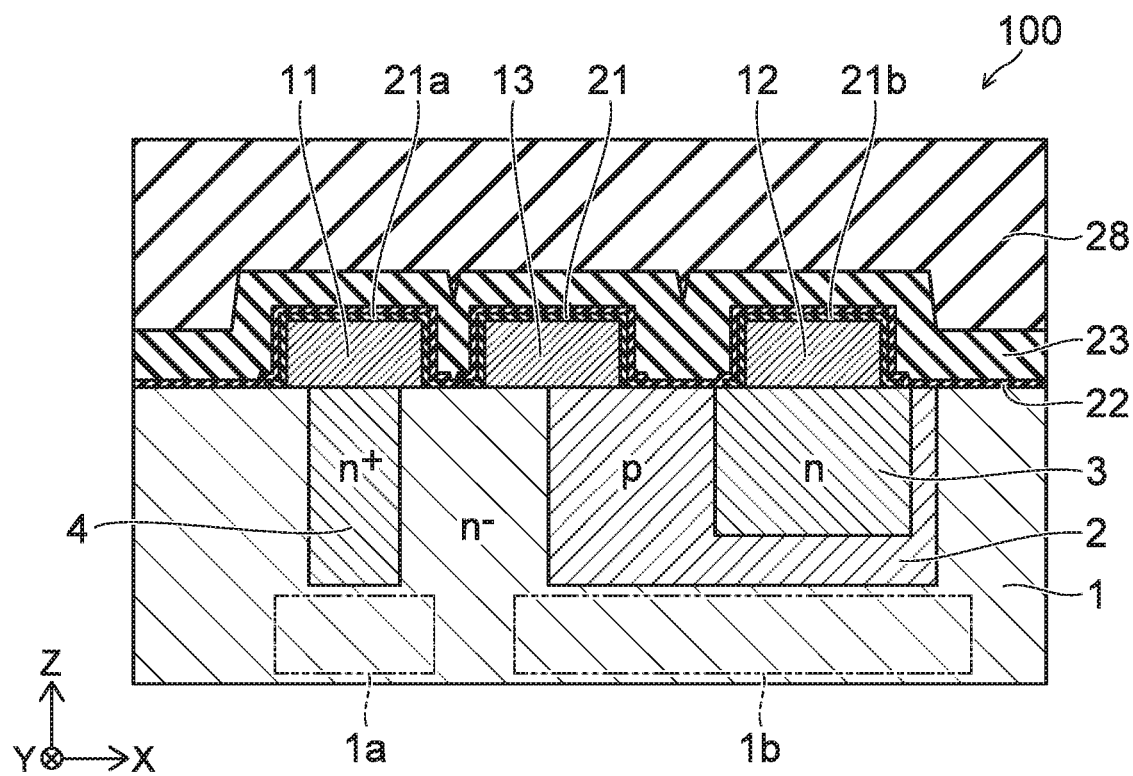
FIG. 1 is a cross-sectional view of a semiconductor device according to a first embodiment.

According to one embodiment, a semiconductor device includes a first semiconductor region, a first electrode, a second semiconductor region, a third semiconductor region, a second electrode, a third electrode, a first layer, and a second layer. The first semiconductor region includes a first region and a second region. The first semiconductor region is of a first conductivity type. The first region and the second region are arranged in a first direction. The first electrode is provided on the first region. The second semiconductor region is provided on the second region. The second semiconductor region is of a second conductivity type. The third semiconductor region is provided on a portion of the second semiconductor region. The third semiconductor region is of the first conductivity type. The second electrode is provided on the third semiconductor region. The second electrode is separated from the first electrode in the first direction. The third electrode is provided on another portion of the second semiconductor region and a portion of the first semiconductor region. The third electrode is separated from the first electrode and the second electrode. The first layer is provided on the third electrode. The first layer includes at least one selected from the group consisting of titanium, nickel, and vanadium. The second layer is provided on the first layer. The second layer includes silicon and at least one selected from the group consisting of nitrogen and oxygen.

In the drawings and the specification of the application, components similar to those described thereinabove are marked with like reference numerals, and a detailed description is omitted as appropriate.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

Embodiments of the invention will now be described with reference to the drawings.

In the drawings and the description recited below, the notations of $n^+$, $n$, $n^-$, and p indicate relative levels of the impurity concentrations of the conductivity types. In other words, a notation marked with "+" indicates that the impurity concentration is relatively higher than that of a notation not marked with either "+" or "−;" and a notation marked with "−" indicates that the impurity concentration is relatively lower than that of a notation without any mark. In the case where both a p-type impurity and an n-type impurity are included in each region, these notations indicate the relative level of the net impurity concentration after the impurities are compensated.

In the embodiments described below, the embodiments may be carried out by reversing the p-type and the n-type of each semiconductor region.

First Embodiment

FIG. 1 is a cross-sectional view of a semiconductor device according to a first embodiment.

As illustrated in FIG. 1, the semiconductor device 100 according to the first embodiment includes an $n^-$-type (first conductivity-type) semiconductor region 1 (a first semiconductor region), a p-type (second conductivity-type) base region 2 (a second semiconductor region), an n-type emitter region 3 (a third semiconductor region), an $n^+$-type collector region 4 (a fourth semiconductor region), a collector electrode 11 (a first electrode), an emitter electrode 12 (a second electrode), a base electrode 13 (a third electrode), a first layer 21, and a second layer 22.

The $n^-$-type semiconductor region 1 includes a first region 1a and a second region 1b. Here, a direction from the first region 1a toward the second region 1b is taken as an X-direction (a first direction). A direction perpendicular to the X-direction is taken as a Z-direction; and a direction perpendicular to the X-direction and the Z-direction is taken as a Y-direction. Although up in the drawing is called "up" and the reverse direction is called "down" for the description, these directions are independent of the direction of gravity.

The first region 1a and the second region 1b are arranged in the X-direction. The $n^+$-type collector region 4 is provided on the first region 1a. The collector electrode 11 is provided on the $n^+$-type collector region 4 and is electrically connected to the $n^+$-type collector region 4. For example, the length in the X-direction of the collector electrode 11 is longer than the length in the X-direction of the $n^+$-type collector region 4. The collector electrode 11 is provided on the $n^+$-type collector region 4 and on a portion of the $n^-$-type semiconductor region 1.

The p-type base region 2 is provided on the second region 1b. The n-type emitter region 3 is provided on a portion of the p-type base region 2. The emitter electrode 12 is provided on the n-type emitter region 3 and is electrically connected to the n-type emitter region 3. The emitter electrode 12 is separated from the collector electrode 11 in the X-direction. For example, the length in the X-direction of the emitter electrode 12 is shorter than the length in the X-direction of the n-type emitter region 3.

The base electrode 13 is provided on another portion of the p-type base region 2 and on a portion of the $n^-$-type semiconductor region 1 and is electrically connected to these semiconductor regions. The base electrode 13 is separated from the collector electrode 11 and the emitter electrode 12. For example, the base electrode 13 is positioned between the collector electrode 11 and the emitter electrode 12.

The n⁻-type semiconductor region 1, the p-type base region 2, the n-type emitter region 3, and the n⁺-type collector region 4 include, for example, silicon as a major component. Or, the n⁻-type semiconductor region 1, the p-type base region 2, the n-type emitter region 3, and the n⁺-type collector region 4 may include silicon carbide, gallium arsenide, or gallium nitride as a major component.

The collector electrode 11, the emitter electrode 12, and the base electrode 13 include at least one selected from the group consisting of aluminum, cobalt, and tungsten.

The first layer 21 is provided on the base electrode 13. In addition to being provided on the base electrode 13, the first layer 21 also may be provided on the n⁻-type semiconductor region 1 and on the p-type base region 2 around the base electrode 13. The first layer 21 includes at least one selected from the group consisting of titanium, nickel, and vanadium.

The second layer 22 is provided on the first layer 21. The second layer 22 includes silicon and at least one selected from the group consisting of nitrogen and oxygen. For example, the second layer 22 is an insulating layer including silicon nitride.

An insulating layer 23 may be provided on the second layer 22. The insulating layer 23 includes silicon and at least one selected from the group consisting of nitrogen and oxygen. For example, the insulating layer 23 includes silicon oxide. The thickness of the insulating layer 23 is greater than the thickness of the second layer 22.

As illustrated in FIG. 1, a layer 21a (a third layer) and a layer 21b (a fourth layer) may be provided respectively on the collector electrode 11 and the emitter electrode 12. The first layer 21, the layer 21a, and the layer 21b are separated from each other in the X-direction. Similarly to the first layer 21, the layers 21a and 21b include at least one selected from the group consisting of titanium, nickel, and vanadium. For example, the second layer 22 and the insulating layer 23 are provided to be continuous on the first layer 21, the layer 21a, and the layer 21b.

For example, an insulative resin layer 28 for sealing the semiconductor device 100 is provided on the insulating layer 23. The resin layer 28 includes, for example, an epoxy resin, polyimide, etc.

Figure 2:
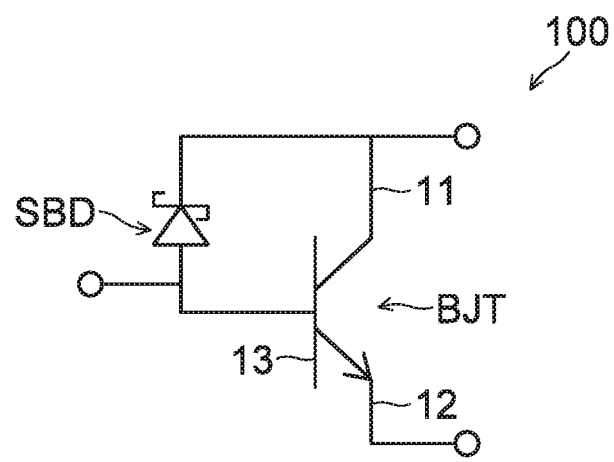
FIG. 2 is an electrical circuit diagram illustrating an equivalent circuit of the semiconductor device according to the first embodiment.

FIG. 2 is an electrical circuit diagram illustrating an equivalent circuit of the semiconductor device according to the first embodiment.

In the semiconductor device 100 as illustrated in FIG. 2, the n⁻-type semiconductor region 1 (the n⁺-type collector region 4), the p-type base region 2, and the n-type emitter region 3 are included in a bipolar transistor BJT. Further, in the semiconductor device 100, a Schottky barrier diode SBD is configured by the n⁻-type semiconductor region 1 and the base electrode 13 having a Schottky junction. The forward direction of the Schottky barrier diode SBD is the direction in which a current flows from the base electrode 13 to the collector electrode 11.

Effects of the first embodiment will now be described.

In the semiconductor device 100 according to the first embodiment, the Schottky barrier diode SBD is formed between the n⁻-type semiconductor region 1 and the base electrode 13. In other words, as illustrated in FIG. 2, the Schottky barrier diode SBD is connected between the collector electrode 11 and the base electrode 13. Thereby, the current (the base current) that flows into the base electrode 13 can be maintained at a prescribed value; and the output of the bipolar transistor BJT can be stabilized more. On the other hand, the characteristics (e.g., the forward voltage) of the Schottky barrier diode SBD are dependent on the state of the interface between the n⁻-type semiconductor region 1 and the base electrode 13. For example, in the case where the state of the interface is changed by an impurity such as moisture or the like moving to the interface from the resin layer 28 and/or outside the semiconductor device 100, the characteristics of the Schottky barrier diode SBD also fluctuate. As a result, the characteristics of the semiconductor device 100 fluctuate.

To suppress the movement of the impurities to the interface between the n⁻-type semiconductor region 1 and the base electrode 13, it is effective to provide an insulating layer (the second layer 22) including silicon which has a high barrier property on the base electrode 13.

On the other hand, there are cases where the second layer 22 includes hydrogen. In the case where the second layer 22 includes hydrogen, there is a possibility that the hydrogen may move to the interface between the n⁻-type semiconductor region 1 and the base electrode 13 in the manufacturing processes of the semiconductor device 100 or with the elapse of time. The hydrogen causes the characteristics of the Schottky barrier diode SBD to fluctuate.

Therefore, in the semiconductor device 100, the first layer 21 that includes at least one selected from the group consisting of titanium, nickel, and vanadium is provided between the base electrode 13 and the second layer 22. These elements easily absorb hydrogen. More specifically, these elements absorb hydrogen more easily than do the aluminum, the cobalt, the tungsten, etc., that are included in the base electrode 13. By providing the first layer 21, it is difficult for the hydrogen included in the second layer 22 to reach the interface between the n⁻-type semiconductor region 1 and the base electrode 13. The fluctuation of the characteristics of the Schottky barrier diode SBD can be suppressed.

According to the embodiment, the fluctuation of the characteristics of the semiconductor device 100 can be suppressed; and the reliability of the semiconductor device 100 can be increased.

It is desirable for the first layer 21 to be further provided on the n⁻-type semiconductor region 1 and on the p-type base region 2 around the base electrode 13. According to this configuration, the movement of the moisture and/or the hydrogen to the surfaces of the n⁻-type semiconductor region 1 and/or the p-type base region 2 around the base electrode 13 can be suppressed. The movement of the hydrogen along these surfaces to the interface between the n⁻-type semiconductor region 1 and the base electrode 13 can be suppressed. Therefore, the reliability of the semiconductor device 100 can be increased further.

Second Embodiment

Figure 3:
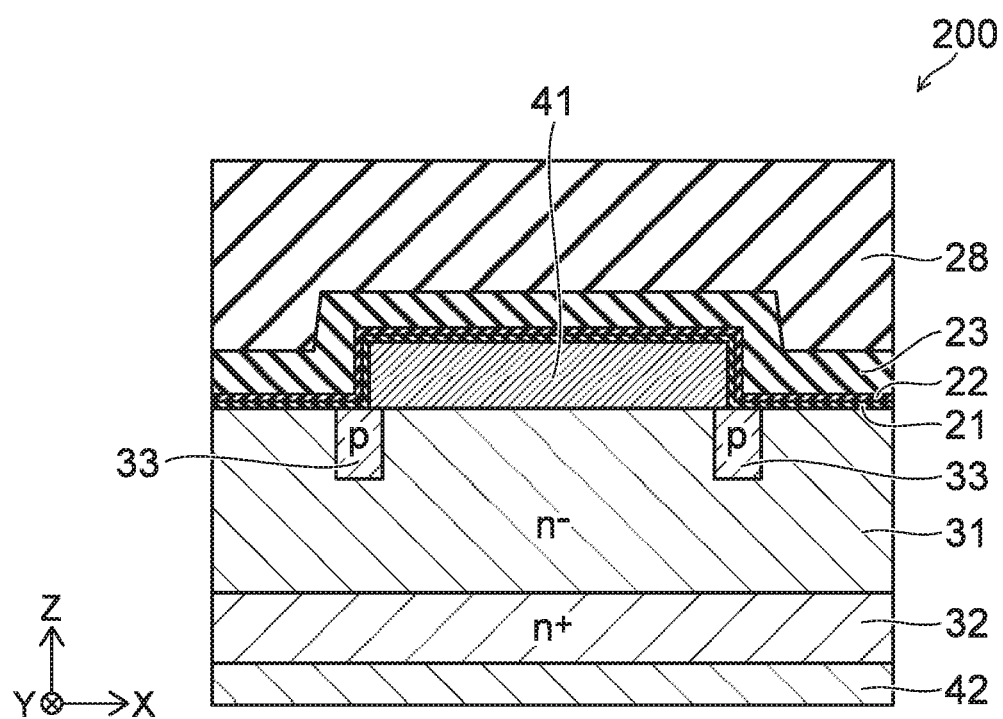
FIG. 3 is a cross-sectional view illustrating a semiconductor device according to a second embodiment.

FIG. 3 is a cross-sectional view illustrating a semiconductor device according to a second embodiment.

As illustrated in FIG. 3, the semiconductor device 200 according to the second embodiment includes an n⁻-type semiconductor region 31 (the first semiconductor region), an n⁺-type cathode region 32 (the second semiconductor region), a p-type guard ring region 33, an anode electrode 41 (the first electrode), a cathode electrode 42 (the second electrode), the first layer 21, and the second layer 22.

The n⁺-type cathode region 32 is provided on the cathode electrode 42 and is electrically connected to the cathode electrode 42. The n⁻-type semiconductor region 31 is provided on the n$^+$-type cathode region 32. The p-type guard ring region 33 is provided in a ring configuration around a portion of the n$^-$-type semiconductor region 31.

The anode electrode 41 is provided on the n$^-$-type semiconductor region 31 and on the p-type guard ring region 33 and is electrically connected to the n$^-$-type semiconductor region 31. The anode electrode 41 has a Schottky junction with the n$^-$-type semiconductor region 31.

The first layer 21 is provided on the anode electrode 41, on the p-type guard ring region 33, and on the outer perimeter of the n$^-$-type semiconductor region 31. The second layer 22 is provided on the first layer 21. The insulating layer 23 is provided on the second layer 22. For example, the resin layer 28 is provided on the insulating layer 23.

The n$^-$-type semiconductor region 31, the n$^+$-type cathode region 32, and the p-type guard ring region 33 include, for example, silicon as a major component. Or, the n$^-$-type semiconductor region 31, the n$^+$-type cathode region 32, and the p-type guard ring region 33 may include silicon carbide, gallium arsenide, or gallium nitride as a major component.

The anode electrode 41 and the cathode electrode 42 include at least one selected from the group consisting of aluminum, cobalt, and tungsten.

In the embodiment as well, the first layer 21 and the second layer 22 are provided on the anode electrode 41. Thereby, the fluctuation of the characteristics over time of the Schottky barrier diode (i.e., the semiconductor device 200) due to the moisture and the hydrogen can be suppressed. Thereby, the reliability of the semiconductor device 200 can be increased.

In addition to being provided on the anode electrode 41, the first layer 21 and the second layer 22 are provided also on the n$^-$-type semiconductor region 31 in the semiconductor device 200. Therefore, the reliability of the semiconductor device 200 can be increased further.

It is possible to confirm the relative levels of the impurity concentrations of the semiconductor regions in the embodiments described above, for example, using a SCM (scanning capacitance microscope). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a SIMS (secondary ion mass spectrometer).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:
   a first semiconductor region including a first region and a second region and being of a first conductivity type, the first region and the second region being arranged in a first direction;
   a first electrode provided on the first region;
   a second semiconductor region provided on the second region, the second semiconductor region being of a second conductivity type;
   a third semiconductor region provided on a portion of the second semiconductor region, the third semiconductor region being of the first conductivity type;
   a second electrode provided on the third semiconductor region, the second electrode being separated from the first electrode in the first direction;
   a third electrode directly contacted on another portion of the second semiconductor region and directly contacted on a portion of the first semiconductor region, the third electrode being separated from the first electrode and the second electrode;
   a first layer provided on the third electrode, the first layer including at least one selected from the group consisting of titanium, nickel, and vanadium;
   a second layer provided on the first layer, the second layer including silicon and at least one selected from the group consisting of nitrogen and oxygen;
   a fourth semiconductor region provided on the first region, the fourth semiconductor region being of the first conductivity type,
   an impurity concentration of the first conductivity type in the fourth semiconductor region being higher than an impurity concentration of the first conductivity type in the first semiconductor region,
   the first electrode being provided on the fourth semiconductor region,
   wherein the first semiconductor region, the second semiconductor region, the third semiconductor region, and the fourth semiconductor region include silicon, and
   the third electrode includes at least one selected from the group consisting of: aluminum, cobalt, tungsten.

2. The device according to claim 1, wherein the first layer and the second layer are further provided on the first semiconductor region and on the second semiconductor region.

3. The device according to claim 1, further comprising a third layer provided on the first electrode, the third layer including at least one selected from the group consisting of titanium, nickel, and vanadium.

4. The device according to claim 1, further comprising a fourth layer provided on the second electrode, the fourth layer including at least one selected from the group consisting of titanium, nickel, and vanadium.

5. The device according to claim 1, wherein the first semiconductor region and the third electrode form a Schottky junction.

6. A semiconductor device, comprising:
   a first semiconductor region including a first region and a second region and being of a first conductivity type, the first region and the second region being arranged in a first direction;
   a first electrode provided on the first region;
   a second semiconductor region provided on the second region, the second semiconductor region being of a second conductivity type;
   a third semiconductor region provided on a portion of the second semiconductor region, the third semiconductor region being of the first conductivity type;
   a fourth semiconductor region provided on the first region, the fourth semiconductor region being of the first conductivity type, an impurity concentration of the first conductivity type in the fourth semiconductor region being higher than an impurity concentration of the first conductivity type in the first semiconductor region, the first electrode being provided on the fourth semiconductor region;
a second electrode provided on the third semiconductor region, the second electrode being separated from the first electrode in the first direction;
a third electrode provided on another portion of the second semiconductor region and a portion of the first semiconductor region, the third electrode being separated from the first electrode and the second electrode;
a first layer provided on the third electrode, the first layer including at least one selected from the group consisting of titanium, nickel, and vanadium; and
a second layer provided on the first layer, the second layer including silicon and at least one selected from the group consisting of nitrogen and oxygen, wherein
the first semiconductor region, the second semiconductor region, the third semiconductor region, and the fourth semiconductor region include silicon, and
the third electrode includes at least one selected from the group consisting of: aluminum, cobalt, tungsten.

\* \* \* \* \*